United States Patent
Schmitt et al.

[11] Patent Number: 5,985,464
[45] Date of Patent: Nov. 16, 1999

[54] COMPOSITE STRUCTURE, AND METHOD OF MAKING SAME

[75] Inventors: Theodore Nicolas Schmitt; Helmut Nechansky, both of Vienna, Austria

[73] Assignee: Electrvac, Fabrikation elektrotechnischer Spezialartikel GmbH, Klosterneuburg, Austria

[21] Appl. No.: 08/796,230

[22] Filed: Feb. 6, 1997

[30] Foreign Application Priority Data

Feb. 8, 1996 [AT] Austria ............................. A231

[51] Int. Cl.⁶ ............................................. B32B 15/04
[52] U.S. Cl. ..................... 428/457; 428/137; 428/192; 428/209; 428/408; 428/411.1; 428/428; 428/433; 428/469; 428/698; 428/702; 501/127; 501/153; 228/120; 228/198
[58] Field of Search ........................ 428/408, 192, 428/411.1, 469, 137, 209, 426, 433, 457, 432, 428, 60, 8, 702; 228/198, 120, 203; 501/127, 153; 156/60; 264/56, 58, 59, 60, 61

[56] References Cited

U.S. PATENT DOCUMENTS

| 3,918,624 | 11/1975 | Kurihara | 228/112 |
|---|---|---|---|
| 4,277,141 | 7/1981 | Kleiber | 350/299 |
| 5,163,499 | 11/1992 | Newkirk et al. | 164/98 |
| 5,238,045 | 8/1993 | Park et al. | 164/97 |
| 5,308,422 | 5/1994 | Askay et al. | 156/89 |
| 5,337,803 | 8/1994 | Divecha et al. | 164/98 |
| 5,490,627 | 2/1996 | Krum et al. | 228/124.1 |

FOREIGN PATENT DOCUMENTS

| 0119 649 A2 | 9/1984 | European Pat. Off. |
| 493 440 | 7/1970 | Switzerland . |
| A3 646 571 | 12/1984 | Switzerland . |
| 1 148 862 | 4/1969 | United Kingdom . |
| 1 480 057 | 7/1977 | United Kingdom . |
| 2 032 310 | 5/1980 | United Kingdom . |
| 2 246 972 | 2/1992 | United Kingdom . |
| 2 299 045 | 9/1996 | United Kingdom . |
| 2 301 545 | 12/1996 | United Kingdom . |
| 2 303 148 | 2/1997 | United Kingdom . |
| WO 92/09388 | 6/1992 | WIPO . |
| WO 95/29023 A1 | 2/1995 | WIPO . |

Primary Examiner—Deborah Jones
Assistant Examiner—Abraham Bahta
Attorney, Agent, or Firm—Henry M. Feiereisen

[57] ABSTRACT

A composite structure includes a first nonmetallic component and a second component of metal or nonmetal, with the first and second components being joined together by a bonding material which is so introduced by way of a casting process as to permeate to an area between the first and second components.

6 Claims, 3 Drawing Sheets

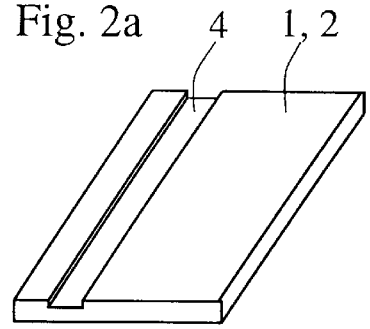
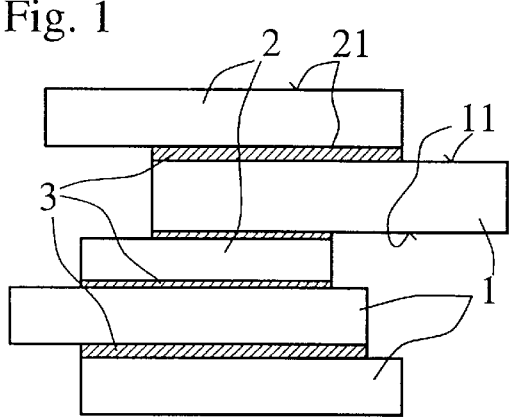
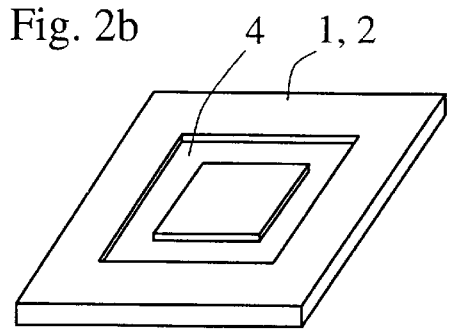
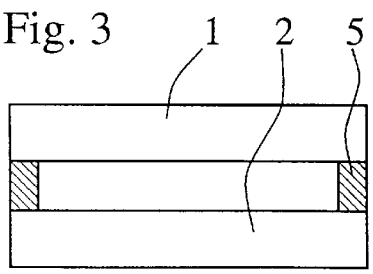
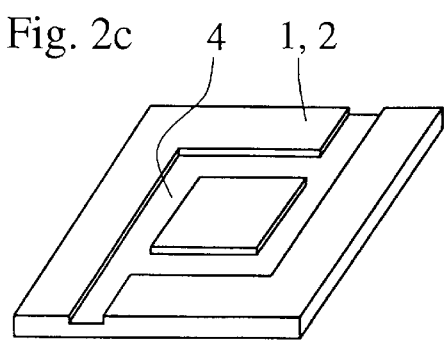

COMPOSITE STRUCTURE, AND METHOD OF MAKING SAME

BACKGROUND OF THE INVENTION

The invention relates to a composite structure, and a method of making same.

Composites are known to include a first nonmetallic component and a second component made either of a metal or a nonmetal, with the first and second components being joined together by a bonding material. Typically, the bonding material is a glue which migrates between the individual components during the bonding process. The bond strength, however, achieved in this manner is too weak for many applications, especially at elevated temperatures. In addition, heat transfer through the glue layer is poor, and the thermal expansion coefficient is much higher compared to metal and nonmetals, e.g. ceramics. It has thus been proposed to utilize soldering to effect a much better bond quality.

Ceramic surfaces which are to be soldered with metal, however, have to be pre-treated, i.e. metallized, with the metallizing step requiring high firing temperatures. If so-called active solders are employed, metallization of the ceramic surface may be omitted, but the actual soldering process is in this case rather complex.

Consequently, soldering is more complicated than gluing, and yet frequently produces only poor results as far as bonding strength is concerned.

Another bonding method involves direct copper bonding (DCB). This process, however, is only suitable for attaching copper to ceramic material.

SUMMARY OF THE INVENTION

It is therefore the object of the present invention to provide an improved composite structure, obviating the afore-stated drawbacks.

In particular, it is an object of the present invention to provide an improved composite structure of the aforementioned type which is comprised of individual components, especially nonmetallic and metallic parts, that are joined together in a superior manner.

It is a further object of the present invention to provide a composite structure with better thermal properties when the components are bonded, i.e. a higher thermal conductivity and smaller differences in thermal expansion between the components.

It is still another object of the invention to provide a method of making a composite structure of the aforementioned type which can be easily implemented.

These objects, and others which will become apparent hereinafter, are attained in accordance with the present invention by so introducing a bonding material through a casting process such as pressure die casting, infiltration and the like as to effect migration and disposition of the bonding material between the first and second components.

A casting process of this type is not very complex and provides reliable bonds; in particular, metallic and nonmetallic components can be joined together with much greater strength than by conventional processes known in the art.

In addition, the number of fabrication steps is substantially reduced so as to minimize manufacturing costs. The composite structure comprised of individual components can be produced in a single processing step.

According to a preferred embodiment of the invention, the bonding material may formed from a metal, such as Al, Cu, Zn, Mg, Ag, Au, Si, Fe, Ti, Ge, Sn or the like, or an alloy thereof. These metals exhibit a relatively low softening temperature, so that they require only little energy for casting.

In addition, examples for nonmetals include ceramic materials like oxides, such as $Al_2O_3$; nitrides such as AlN; silicides; carbides, such as SiC; NTC or PCT ceramics; or diamond, graphite and the like, or mixtures thereof. These materials exhibit a high strength as well as good thermal conductivity.

It is also within the scope of the present invention to provide the metal components of Al, Cu, Fe, Ni, Ag, Mo, W, Co, Nb or the like, or of alloys thereof. These materials exhibit good thermal conductivity, so that a composite body comprising these metals will also exhibit a high thermal conductivity.

In accordance with another feature of the invention, at least one additional body made of the bonding material may be cast onto the composite structure. Such cast-on parts may be fabricated at the same time when the composite components are bonded together, thereby eliminating another processing step.

Preferably, the composite structure is formed by a porous nonmetallic component, a dense nonmetallic component positioned on the latter and a metallic component disposed upon the dense nonmetallic component. In this manner, a MMC component which is in connection with a metal can be so produced as to be electrically insulated from the metallic element by the dense ceramic component.

A composite structure in accordance with the present invention is made by positioning the nonmetallic components and, if necessary, the metallic components contiguous to one another, and subsequently casting this arrangement with bonding material. During the casting process, the bonding material penetrates between the individual components to bond them in a superior fashion.

Suitably, at least one of the surfaces of adjacent components facing each other is roughened before the components are placed in contiguous disposition. This facilitates the infiltration or migration of the bonding material between the individual components, and the bonding strength is increased. A roughening of the surfaces can be accomplished by forming grooved channels. Thus, a greater amount of bonding material can be introduced in a simple manner between two components.

According to another feature of the present invention, the components may be placed in contiguous relationship at interposition of spacers. In this way, a layer of bonding material with a predetermined thickness can be applied over the entire surface area between the two components.

Preferably, a nonmetallic component is used which is porous, at least in certain regions, preferable on its surface facing a metallic component. In this way, a metal-matrix material can be fabricated in a single casting step which is bonded simultaneously to other components to form a composite structure.

In accordance with a preferred method of the present invention, a dense nonmetallic component is placed upon a porous nonmetallic component, and a metallic component is disposed on the dense nonmetallic component, before executing the casting process for infiltration of bonding material. This process results in a composite structure of particularly advantageous properties, especially high mechanical strength coupled with high thermal conductivity.

Advantageously, the casting the composite elements includes casting of at least one body made of the bonding material on the composite. In this way, two operations, namely bonding of the individual components and casting of an additional body, can be combined into a single processing step.

In accordance with another feature of the present invention, electrical contacts may be formed by placing a metal core onto a densely fired ceramic component serving as a printed circuit board, and allowing a bonding material to infiltrate the entire structure. This very simple process enables a single manufacturing step to produce a printed circuit board with strip conductors and contacts.

BRIEF DESCRIPTION OF THE DRAWING

The above and other objects, features and advantages of the present invention will now be described in more detail with reference to the accompanying drawing, in which FIG. 1 is a sectional front view of a basic configuration of a nonmetallic-metallic composite structure according to the invention;

FIGS. 2a–c are perspective views of nonmetallic or metallic components of a composite structure provided with channels in accordance with the invention;

FIG. 3 is a sectional front view of a contiguous arrangement of nonmetallic and metallic components;

FIGS. 9b, c are a front view and top view of an application of the composite structure of FIG. 9a.

DESCRIPTION OF PREFERRED EMBODIMENTS

Figure 4:
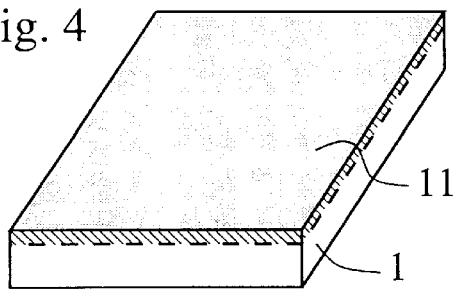
FIG. 4 is a perspective view of a nonmetallic component with a porous surface.

Referring now to the drawing and in particular to FIG. 1, there is shown a sectional front view of a general configuration of a composite structure according to the invention, including a number of nonmetallic components 1 of different shapes, and additional components 2 which may be made of nonmetallic material or metal. The arrangement of components 1, 2 is held together by a bonding material 3 which is received between the components 1, 2 by a casting process, e.g. die casting, infiltration or the like. Typically, the casting process includes a mold in which the structure to be formed, i.e. the arrangement of components 1, 2 is received. The bonding material 3 typically in form of a liquid metal is then poured under pressure into a mold to surround and to infiltrate the components 1, 2. After the casting process, the metal is removed from the surface of the formed body 1 in such a manner that the bonding material 3 remains only in area between the components 1, 2. The manner of carrying out a casting process is generally known to a person skilled in the art so that a detailed description thereof is omitted for the sake of simplicity.

Examples of metal in the event the components 2 is made of metal include Al, Cu, Fe, Ni, Ag, Mo, W, Co, Nb or the like, or alloys thereof. Examples of nonmetallic material for the component 1 and for the component 2 in the event the component 2 is intended to be made of nonmetallic material include ceramics like oxides, such as $Al_2O_3$; nitrides, such as AlN; suicides; carbides, such as SiC; NTC or PCT ceramics; or diamond, graphite and the like, or mixtures of the listed materials. Examples for the bonding material 3 include preferably a metal, such as Al, Cu, Zn, Mg, Ag, Au, Si, Fe, Ti, Ge, Sn and the like, or an alloy thereof.

The composite structure of the present invention is made by placing the individual components 1, 2 in contiguous disposition, e.g. closely next to each other or above one another, and by subsequently encasing them. The bonding material 3 is capable of migrating between the components 1, 2 as a result of an always existing slight surface roughness so that the components 1, 2 are connected firmly together in a non-detachable fashion. In order to increase the amount of bonding material 3 permeating between the components 1, 2, one or both opposing surfaces 11, 21 of two contiguous components are further roughened. Roughening may be accomplished simply by grinding or, as illustrated in FIGS. 2a to 2c, by forming groove-like channels 4. These channels 4 may have arbitrary depths, cross-sections and orientations; however, with respect to manufacturing efficiency, channels 4 running straight and having a rectangular cross-section, as illustrated in the FIGS. 2a to 2c, are most economical. The channels 4 can be made by machining the components 1, 2, e.g. milling, grinding or the like, or, if possible, formed during production of the components 1, 2, e.g. through specially shaped pressing or casting tools.

The channels 4 may extend to the edges of the components 1, 2 so as to be capable of both conducting and receiving the bonding material 3, or the channels 4 may be formed only in an inside area of the components 1, 2 in which case they are only capable of containing the bonding material 3 while conduction of bonding material is effected via the surface roughness and thereby created gaps between the two components 1, 2.

FIG. 3 shows a modification of a composite structure according to the invention, in which the components 1, 2 are distanced from one another by spacers 5 so as to allow formation of a continuous, wide layer of bonding material between the components 1, 2. The spacers 5 can be made of metal such as Al, Cu, Zn, Mg, Ag, Au, Si, Fe, Ti, Ge, Sn or the like, as well as of porous or dense ceramics, ceramic short fibers, or porous packing of powder. The packed powder itself may be formed e.g. from, carbides, nitrides, silicides, or metals such as W, Ag, Ni, Mg, Co, Nb or the like.

In order to increase the adhesion of the bonding material 3 to nonmetallic components 1, the surface 11 of the nonmetallic component 1 facing the metal component 2 is made porous, as indicated in FIG. 4. Thus, bonding material 3 is able to permeate into the surface 11 and thereby adhere particularly well to the nonmetallic component 1. If a metal is used as bonding material 3, then a so-called metal-matrix material exhibiting exceptionally high mechanical strength and high thermal conductivity is formed as a result of the infiltration of the pores of the nonmetallic surface 11.

Figure 5A:
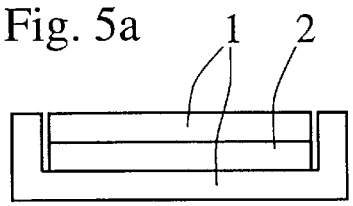
FIGS. 5a, b are a sectional front view and a perspective view of different possible configurations for composite structures according to the present invention.
Figure 5B:
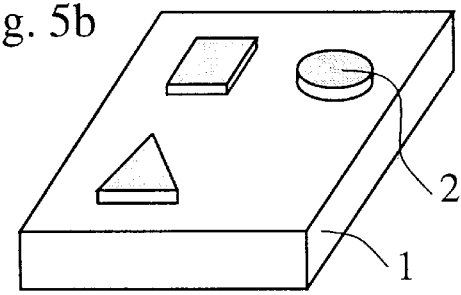

As stated above, the components 1, 2 can have any size and shape. By way of example, FIG. 5 shows a nonmetallic component 1 in the shape of a trough for receiving a metallic component 2 and a further nonmetallic component 1. If this composite is intended as a casing for an electric or electronic circuit, suitable holes and conducting pathways are formed at respective areas of the nonmetallic components 1 and metallic component 2. The composite of FIG. 5b comprises as nonmetallic component 1 a ceramic substrate for carrying plate-like metallic components 2 which exhibit a surface area that is significantly smaller than the surface of the ceramic substrate 1.

Figure 6:
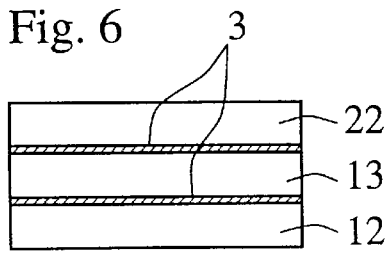
FIG. 6 is a sectional front view of another embodiment of a composite structure of the present invention.

FIG. 6 shows another preferred embodiment of a composite according to the present invention, including in superimposed contiguous disposition a porous, nonmetallic component 12, a dense nonmetallic component 13 and a metallic component 22. This assembly is then subject to a casting process with bonding material 3 which not only permeates between the individual components, 12, 13, 22, but also infiltrates the porous nonmetallic component 12, to thereby create a MMC material. Examples for a material for use as nonmetallic components 12, 13 include preferably porous or dense ceramic material, e.g. oxides, nitrides, silicides, carbides or the like, but also diamond, graphite or the like. As already stated above, the individual components may have arbitrary geometrical shapes.

Figure 7:
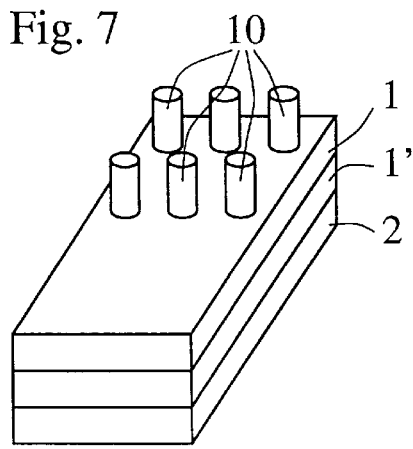
FIG. 7 is a perspective view of a variation of the composite structure of FIG. 6.

FIG. 7 shows another configuration of a composite according to the present invention, with the uppermost ceramic component 1 being made of porous material, the subjacent component 1' being made of densely fired ceramic material, and the bottom component 2 being made of metal. By placing the structure of FIG. 7 into a suitably shaped mold, protrusions 10 may be formed during casting of the structure and infiltration of the ceramic component 1. The protrusions 10 are intended to increase the surface area of the composite and thereby to reduce the thermal resistance between the composite and the ambient atmosphere. Serving the same purpose, the composite may also be formed with longitudinal ribs or transverse ribs, grooves, etc. It is also possible to substitute the ceramic components 1 by a component of graphite or diamond.

Figure 8A:
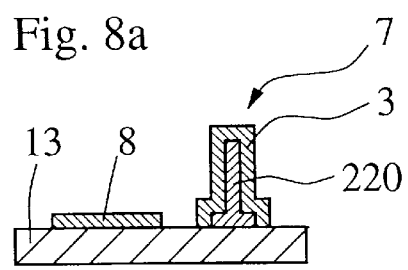
FIGS. 8a, b are a sectional front view of another embodiment of a composite structure of the present invention.

Another variation of a composite according to the invention is shown in FIG. 8a which depicts a printed circuit board 13 of densely fired ceramic material. The ceramic component 13 carries a metallic core 220 of an electrical contact 7. Subsequently, the ceramic component 13 and the metallic core 220 are encased with bonding material 3. Thus, the metallic core 220 is fixed in place by the ceramic component 13 which in turn is surrounded by bonding material 3. The bonding material 3 should have a high electrical conductivity to enable creation of strip conductors 8 on the printed circuit board during the casting process.

Figure 8B:
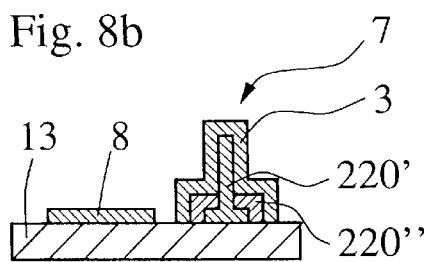

FIG. 8b illustrates a modification of the composite of FIG. 8a, with the difference residing in the provision of a metal core of multi-part configuration, e.g. of two parts 220', 220, as shown in FIG. 8b.

Figure 9A:
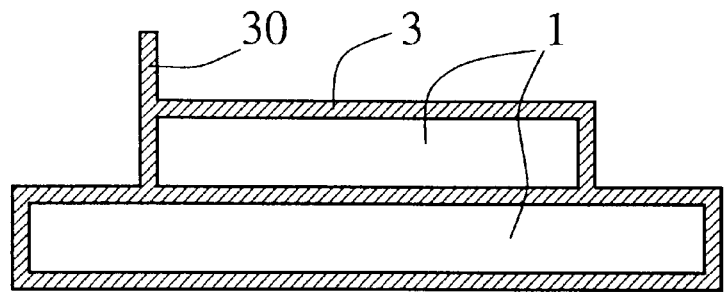
FIG. 9a is a front view of still another embodiment of a composite structure according to the present invention.
Figure 9B:
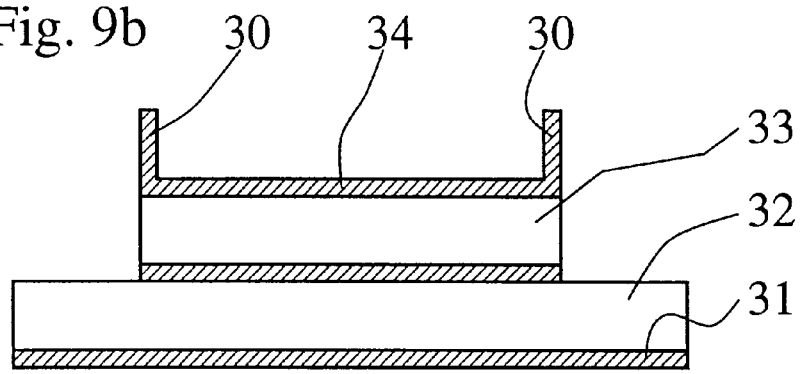
Figure 9C:
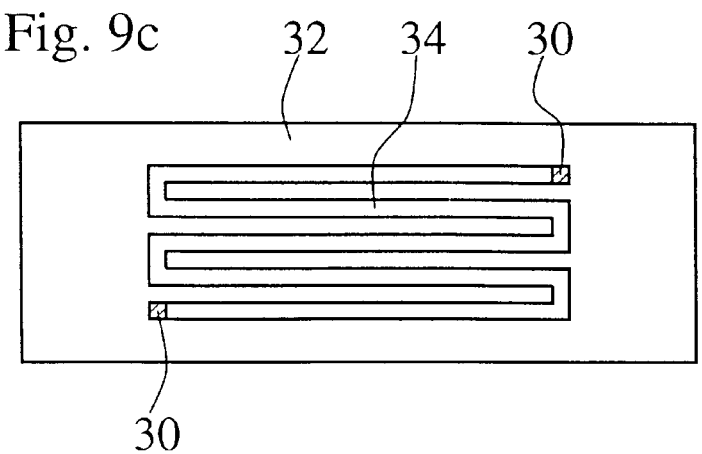

FIG. 9a shows a composite formed of two nonmetallic components 1 which are joined together by bonding material 3. The two components 1 are joined in a single processing step during which at least one additional body 30 is cast onto the composite. Such a composite can be used, for example, as a heating element and includes as bonding material 3 a heating conductor metal, a heating conductor ceramics or NTC or PTC ceramics. Excess bonding material 3 is removed after the casting process in a manner shown in FIGS. 9b and 9c. Thus, a heating device is formed with a metallic surface 31, a heat transfer plate 32 and a heater 34 which is thermally insulated from the heat transfer plate 32 by a nonmetallic intermediate layer 33, with the electric supply lines to the heater 34 being formed by the additional cast-on body 30. This type of heating element can thus be made by only two operational steps, i.e. bonding the individual components and removing the excess bonding material.

While the invention has been illustrated and described as embodied in a composite structure and method of making same, it is not intended to be limited to the details shown since various modifications and structural changes may be made without departing in any way from the spirit of the present invention.

What is claimed as new and desired to be protected by Letters Patent is set forth in the appended claims:

What is claimed is:

1. A composite structure, comprising:
   a first component made of a porous nonmetallic material;
   a second component being positioned upon the first component and made of a dense nonmetallic material
   a metallic body arranged upon the second component; and
   a bonding material for joining together the first and second components and said metallic body, said bonding material being different from the material of the metal body and being introduced by a casting process so as to allow permeation of bonding material to an area between the first and second components and the metallic body.

2. The composite structure of claim 1 wherein the bonding material is made of a metal selected from the group consisting of Al, Cu, Zn, Mg, Ag, Au, Si, Fe, Ti, Ge, Sn and an alloy thereof.

3. The composite structure of claim 1 wherein the first and second components are made from a ceramic material selected from the group consisting of oxides, nitrides, silicides, carbides, diamond and graphite.

4. The composite structure of claim 3 wherein the oxides include $Al_2O_3$.

5. The composite structure of claim 3 wherein the carbides include SiC, NTC-ceramics or PTC-ceramics.

6. The composite structure of claim 1, and further comprising an additional body formed on the composite structure by casting and made of a same material as the bonding material.

* * * * *